US009385179B2

(12) United States Patent
Nakos et al.

(10) Patent No.: US 9,385,179 B2
(45) Date of Patent: Jul. 5, 2016

(54) DEEP TRENCH DECOUPLING CAPACITOR AND METHODS OF FORMING

(71) Applicant: GLOBALFOUNDRIES INC., Grand Cayman (KY)

(72) Inventors: James S. Nakos, Essex Junction, VT (US); Edmund J. Sprogis, Williston, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 155 days.

(21) Appl. No.: 13/765,105

(22) Filed: Feb. 12, 2013

(65) Prior Publication Data
US 2013/0147015 A1 Jun. 13, 2013

Related U.S. Application Data

(62) Division of application No. 12/685,156, filed on Jan. 11, 2010, now Pat. No. 8,492,816.

(51) Int. Cl.
H01L 27/108 (2006.01)
H01L 29/94 (2006.01)
H01L 49/02 (2006.01)
H01L 29/66 (2006.01)

(52) U.S. Cl.
CPC .......... *H01L 28/40* (2013.01); *H01L 29/66181* (2013.01); *H01L 29/945* (2013.01)

(58) Field of Classification Search
USPC .......... 257/284, 301, 330, E21.396, E21.651, 257/E27.092, E27.095, E29.201, E29.257, 257/E29.26, E29.346; 438/243, 244, 259, 438/270, 386, 387
See application file for complete search history.

(56) References Cited

U.S. PATENT DOCUMENTS

| 6,124,611 | A  | * | 9/2000  | Mori ................ H01L 29/66666 257/329 |
| 6,177,697 | B1 | * | 1/2001  | Cunningham ................ 257/301 |
| 6,194,755 | B1 |   | 2/2001  | Gambino et al. |
| 6,664,161 | B2 |   | 12/2003 | Chudzik et al. |
| 6,774,005 | B2 |   | 8/2004  | Gutsche et al. |
| 7,193,262 | B2 |   | 3/2007  | Ho et al. |
| 2002/0024081 | A1 | | 2/2002 | Gratz |
| 2003/0207531 | A1 | | 11/2003 | Lin |
| 2010/0237412 | A1 | * | 9/2010 | Shrivastava ......... H01L 29/0653 257/336 |

OTHER PUBLICATIONS

U.S. Appl. No. 12/685,156, filed Nov. 11, 2010, Office Action dated Sep. 14, 2012.
Li, Notice of Allowance and Fee(s) Due for U.S. Appl. No. 12/685,156 dated Apr. 3, 2013, 8 pages.

* cited by examiner

*Primary Examiner* — Meiya Li
(74) *Attorney, Agent, or Firm* — Anthony Canale; Hoffman Warnick LLC

(57) ABSTRACT

Solutions for forming a silicided deep trench decoupling capacitor are disclosed. In one aspect, a method of forming a semiconductor device includes: forming an outer trench in a silicon substrate, the forming exposing portions of the silicon substrate below an upper surface of the silicon substrate; depositing a dielectric liner layer inside the trench; depositing a doped polysilicon layer over the dielectric liner layer, the doped polysilicon layer forming an inner trench in the silicon substrate; forming a silicide layer over a portion of the doped polysilicon layer; forming an intermediate contact layer within the inner trench; and forming a contact over a portion of the intermediate contact layer and a portion of the silicide layer.

4 Claims, 6 Drawing Sheets

DEEP TRENCH DECOUPLING CAPACITOR AND METHODS OF FORMING

CROSS-REFERENCE TO RELATED APPLICATIONS

This application is a divisional application of co-pending U.S. patent application Ser. No. 12/685,156, filed on Jan. 11, 2010, which is currently pending, and is hereby incorporated by reference in its entirety.

BACKGROUND

The subject matter disclosed herein relates to a deep trench decoupling capacitor and methods of forming thereof. Specifically, the subject matter disclosed herein relates to a structure and method for reducing the parasitic resistance of a deep trench capacitor.

Decoupling capacitors, or "bypass" capacitors, are used to decouple one portion of an electrical network from another. In some configurations, deep trench capacitors (DZ) are used as decoupling capacitors. For example, in silicon carriers, DZs may be used to divert electrical noise from a circuit component. However, DZs may also adversely affect the semiconductor structure due to their parasitic resistance.

BRIEF DESCRIPTION

Solutions for forming a silicided or metalized deep trench decoupling capacitor are disclosed. In one aspect, a semiconductor structure includes a trench capacitor within a silicon substrate, the trench capacitor including: an outer trench extending into the silicon substrate; a dielectric liner layer in contact with the outer trench; a doped polysilicon layer over the dielectric liner layer, the doped polysilicon layer forming an inner trench within the outer trench; and a silicide layer over a portion of the doped polysilicon layer, the silicide layer separating at least a portion of the contact from at least a portion of the doped polysilicon layer; and a contact having a lower surface abutting the trench capacitor, a portion of the lower surface not abutting the silicide layer.

A first aspect of the invention provides a semiconductor structure comprising: a trench capacitor within a silicon substrate, the trench capacitor including: an outer trench extending into the silicon substrate; a dielectric liner layer in contact with the outer trench; a doped polysilicon layer over the dielectric liner layer, the doped polysilicon layer forming an inner trench within the outer trench; and a silicide layer over a portion of the doped polysilicon layer, the silicide layer separating at least a portion of the contact from at least a portion of the doped polysilicon layer and a contact having a lower surface abutting the trench capacitor, a portion of the lower surface not abutting the silicide layer.

A second aspect of the invention provides a method of forming a semiconductor device, the method comprising: forming an outer trench in a silicon substrate, the forming exposing portions of the silicon substrate below an upper surface of the silicon substrate; depositing a dielectric liner layer inside the trench; depositing a doped polysilicon layer over the dielectric liner layer, the doped polysilicon layer forming an inner trench in the silicon substrate; forming a silicide layer over a portion of the doped polysilicon layer; forming an intermediate contact layer within the inner trench; and forming a contact over a portion of the intermediate contact layer and a portion of the silicide layer.

A third aspect of the invention provides a method of forming a semiconductor device, the method comprising: forming a trench in a silicon substrate, the forming exposing portions of the silicon substrate below an upper surface of the silicon substrate; depositing a dielectric liner layer inside the trench and over an upper surface of the silicon substrate; depositing a doped polysilicon layer over a portion of the dielectric liner layer inside the trench and over a portion of the dielectric liner layer over the upper surface of the silicon substrate; forming a silicide layer over the doped polysilicon layer; and forming a contact over a portion of silicide layer, the contact being mis-aligned with the trench.

A fourth aspect of the invention provides a semiconductor structure comprising: a silicon substrate; a trench capacitor including: a trench extending into the silicon substrate; a dielectric liner layer in contact with the trench and extending over an upper surface of the silicon substrate; a doped polysilicon layer over a portion of the dielectric liner layer inside the trench and over a portion of the dielectric liner layer over the upper surface of the silicon substrate; and a silicide layer over a portion of the doped polysilicon layer; and a contact over a portion of silicide layer, the contact being mis-aligned with the trench.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), sub-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
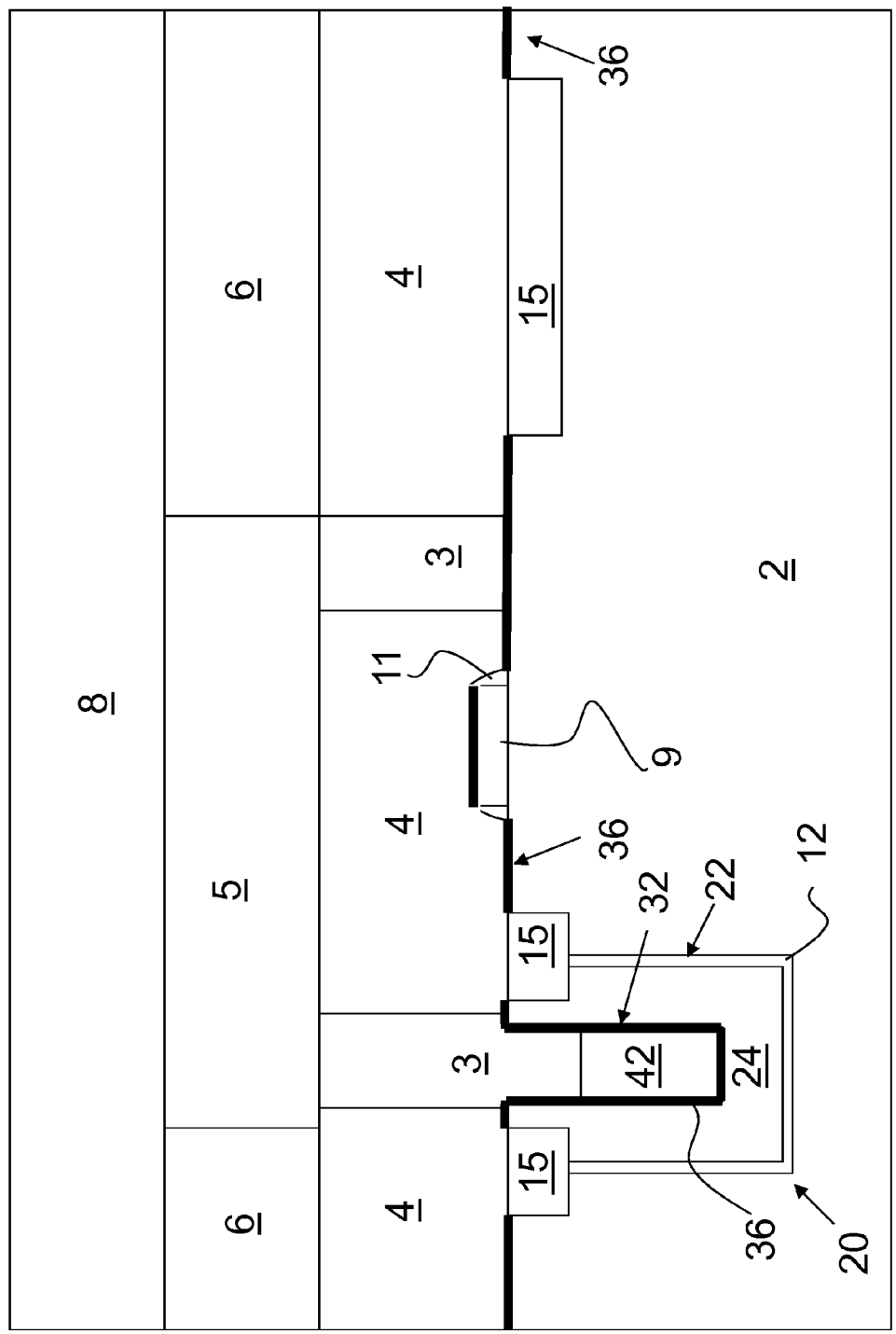
FIGS. 1-3 show cross-sectional views of semiconductor structures according to embodiments.

Turning to the drawings, FIG. 1 shows a semiconductor structure according to one embodiment of the invention. The semiconductor structure may include a substrate 2. Substrate 2 may include one or more materials such as silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, substrate 2 may be strained. In one embodiment, substrate 2 is silicon based. In another embodiment, substrate 2 includes a semiconductor on insulator substrate, e.g. silicon bonded to an insulator such as sapphire or quartz; or a silicon/silicon dioxide/silicon sandwich.

Turning to FIG. 1, a semiconductor structure according to an embodiment of the invention is shown. In this embodiment, the semiconductor structure may include a contact 3 and a trench capacitor 20 within substrate 2 (e.g., a silicon substrate). Trench capacitor 20 may include: an outer trench 22 extending into silicon substrate 2, a dielectric liner layer 12 in contact with outer trench 22, a doped polysilicon layer 24 over dielectric liner layer 12, doped polysilicon layer 24 forming an inner trench 32 within outer trench 22, and a silicide layer 36 over a portion of doped polysilicon layer 24. Abutting trench capacitor 20 may be shallow trench isolations (STI) 15, which may be formed according to known methods and may be used to block a silicide (36) from bridging over portions of dielectric liner layer 12 formed within outer trench 22 (e.g., dielectric liner layer 12 formed in trench capacitor 20). As shown, STIs 15 may be formed below a portion of silicide layer, and may abut a portion of doped polysilicon layer 24. Overlying substrate 2 is shown a transistor 9, which may be abutted by one or more spacers 11 (e.g., dielectric spacers). Spacers 11 may prevent formation of a silicide (e.g., silicide 36) over portions of transistor 9.

Outer trench 22 may be formed according to conventional techniques, such as masking and etching of substrate 2 to form an opening. Inner trench 32 may be formed, for example, by depositing dielectric liner layer 12 within outer trench 22. In one embodiment, dielectric liner layer 12 may have a thickness of approximately 10 nm. Depositing of dielectric liner layer 12 may be performed using any deposition techniques described herein and/or known in the art. For example, in one embodiment, dielectric liner layer 12 is deposited using LPCVD. Dielectric liner layer 12 may be formed, for example, of an oxide-nitride-oxide (ONO) dielectric. Doped polysilicon layer 24 may be formed using any known method, including, for example, deposition of a polysilicon over dielectric liner layer 12 followed by ion implantation of the polysilicon. In another embodiment, doped polysilicon layer 24 may be doped in-situ and formed over dielectric liner layer 12 using a conventional technique, such as LPCVD. In one embodiment, doped polysilicon layer 24 is formed by in-situ doping using arsenic (As). Inner trench 32 may be formed either by not completely filling remaining portions of outer trench 22 (those not filled by dielectric liner layer 12) with doped polysilicon layer 24 or by filling the remaining portions of outer trench 22 with doped polysilicon layer 24 and etching back. The etch back may be performed, for example, using a reactive ion etching (RIE) or wet etch process on doped polysilicon layer 24, either with or without a mask. For either method of forming inner trench 32, damascene processes may be used to fill the deep trench capacitor 20 and form STI 15 structures.

In one embodiment, as shown in FIG. 1, a silicide layer 36 may be formed over inner trench 32 in direct contact with doped polysilicon layer 24. Silicide layer 36 may be formed using any technique known in the art, e.g., depositing a metal such as titanium, nickel, cobalt, platinum, etc., annealing to have the metal react with silicon, and removing unreacted metal. Silicide layer 36 may further be formed over portions of substrate 2 and transistor 9. However, in this embodiment, silicide layer 36 is further formed over doped polysilicon layer 24 within inner trench 32. In any case, silicide layer 36 may separate at least a portion of a contact 3 from at least a portion of doped polysilicon layer 24. After forming silicide layer 36 over doped polysilicon layer 24 (and other portions of substrate 2 and transistor 9), a dielectric layer 42 may optionally be formed over silicide layer 36 within inner trench 32. Dielectric layer 42 may include, for example, silicon dioxide, lower silicon nitride, silicon carbonitride, silicon carbide, PSG, BPSG, SiCOH, or other premetals and may be formed using any techniques described herein and/or known in the art. In one embodiment, dielectric layer 42 may be deposited to fill a remaining portion of inner trench 32, and etched back or polished back below an upper surface of substrate 2. Etching may be performed, for example, using a RIE process, while polishing may be performed using, for example, chemical-mechanical polishing (CMP). After removing (e.g., etching) portions of dielectric layer 42, a premetal dielectric (PMD) layer 4 may be formed over exposed portions of silicide 36, STIs 15, spacers 11, etc. In one embodiment, PMD layer 4 may be formed of a thin (e.g., 40 nm) barrier dielectric, such as silicon nitride, silicon carbonitride, silicon carbide, or a similar dielectric, followed by a thick (e.g., 500 nm) upper silicon dioxide, such as, e.g., PSG, BPSG, SiCOH, or similar layer. Alternatively, the thin barrier dielectric can be omitted. Where not omitted, the thin barrier dielectric in PMD layer 4 may be used as a mobile ion barrier and/or an etch stop for a subsequent contact etching process. The thick upper silicon dioxide layer may be used, for example, for gettering mobile ions, such as Na and K.

PMD layer 4 may be deposited over silicide 36, STIs 15, spacers 11, etc. and patterned with contacts 3 such that a portion of dielectric layer 42 (in inner trench 32) remains exposed after forming of PMD layer 4. In another embodiment, PMD layer 4 may be deposited, patterned, and selectively etched to expose portions of dielectric layer 42 to enable subsequent formation of a contact (e.g., contact 3). After formation of PMD layer 4, a contact 3 may be formed over exposed portions of dielectric layer 42 within inner trench 32. Contact 3 may be formed of any suitable contact metal, and in one embodiment, may be formed of tungsten lined with a refractory metal, such as titanium nitride (TiN) or titanium/titanium-nitride (Ti/TiN). Contact 3 may be formed such that a portion of contact 3 contacts a vertical sidewall of silicide layer 36 within inner trench 32, and partially fills each of outer trench 22 and inner trench 32. Contact 3 may be formed using any techniques known in the art, and may be formed at substantially the same time as a second contact 3 (e.g., a contact stud). Contact 3 can be formed using any known method, including a damascene tungsten process using a thin TiN liner. As shown in FIG. 1 (and similarly in FIGS. 2 and 3), contact 3 may be formed such that a portion of its lower surface is not in contact with silicide 36. For example, in the embodiment shown in FIG. 1, a portion of the lower surface of contact 3 abuts dielectric layer 42.

After forming contact 3, a second dielectric layer 6, including one of a dielectric such as silicon dioxide, fluorosilicate glass (FSG), carbon-doped silicon oxide (SiCOH), or the like, may be deposited over contacts 3 and PMD layer 4. A first level metal wire 5 may be formed in second dielectric layer 6 using, e.g., a damascene copper process with a refractory metal liner including, e.g., tantalum (Ta). Alternatively, the first level metal wire 5 may be formed using a subtractive etch process, where metal is deposited directly over the contacts studs 3, that metal is patterned, and subsequently etched. If damascene copper is used to form first level metal wires 5, then a copper diffusion barrier 8, such as a dielectric film formed from silicon nitride, silicon carbide, or silicon carbon nitride, may be deposited thereover. Alternatively, a selective metal deposition (e.g., cobalt tungsten phosphide (CoWP)) may be performed using electroplating, CVD, or ALD to provide a copper diffusion barrier. This selective metal deposition could be combined with a dielectric cap. In any case, trench capacitor 20 may be formed in substrate 2, and may allow for improved performance over prior art capacitors by, for example, reducing parasitic resistance.

Figure 2:
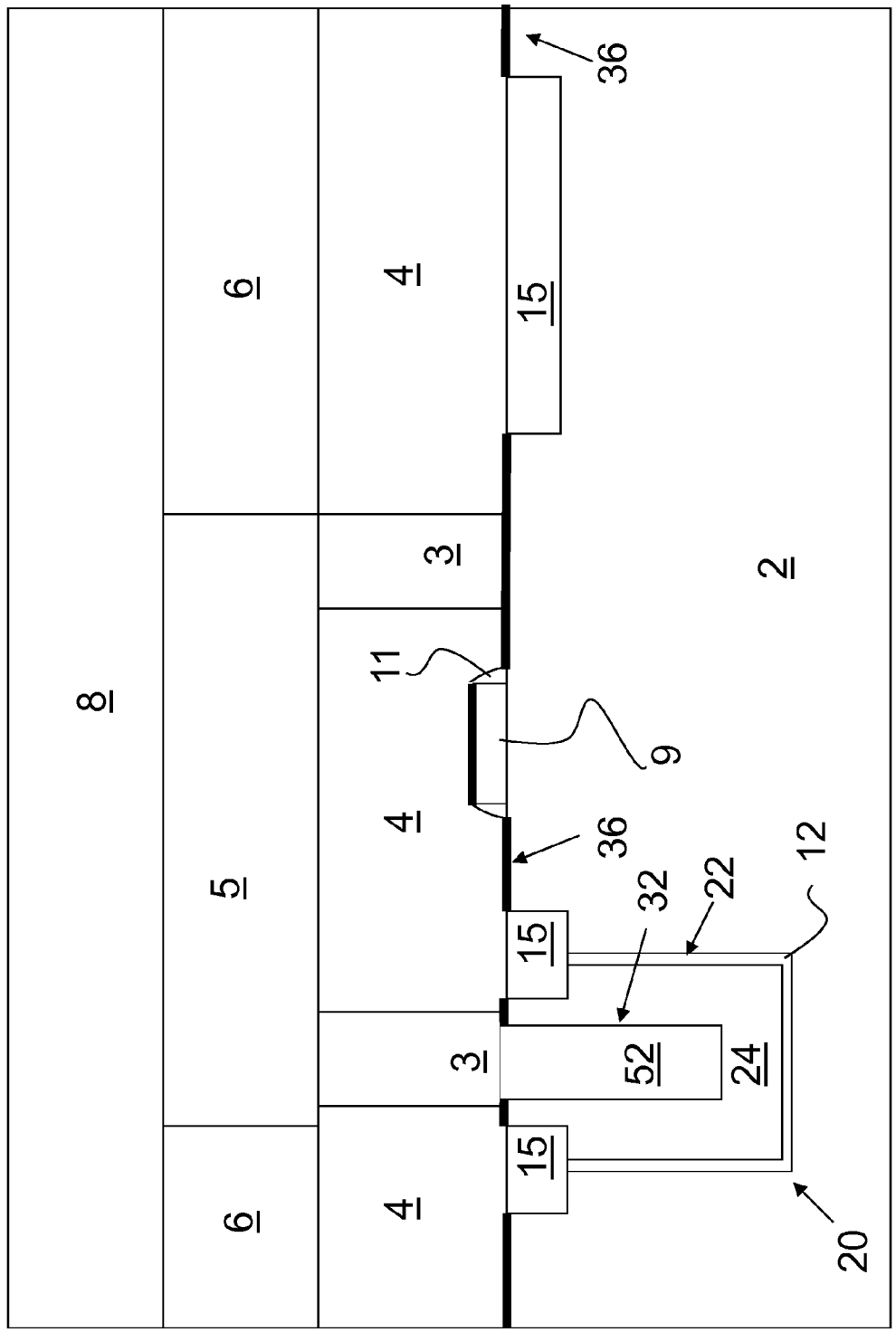

Turning to FIG. 2, an alternative embodiment of the semiconductor structure of FIG. 1 is shown. In this embodiment, formation of outer trench 22 and inner trench 32 may be performed substantially similarly as shown and described with reference to FIG. 1. However, as shown in FIG. 2, after forming of doped polysilicon layer 24, an intermediate contact layer (e.g., a deposited silicide such as tungsten silicide) 52 may be formed directly over doped polysilicon layer 24. In one embodiment, intermediate contact layer 52 may fill inner trench 32 up to approximately a top surface of substrate 2. Intermediate contact layer 52 may be formed using any deposition techniques described herein and/or known in the art, for example, by depositing a tungsten silicide immediately after the polysilicon 24 in-situ without a vacuum break, such that the polysilicon 24 surface is not oxidized (e.g., forming a tungsten polycide). Subsequently a damascene CMP process may be used to substantially planarize the wafer (e.g., to approximately the top surface of substrate 2) and remove excess polysilicon and/or tungsten silicide from the wafer surface. In another embodiment, intermediate contact layer 52 may be deposited to over-fill inner trench 32 and may be etched back to remove portions of intermediate contact layer 52 extending above an upper surface of substrate 2. In any case, intermediate contact layer 52 may substantially fill inner trench 32, and may contact both silicide 36 and contact 3. Silicide 36 may be formed before or after intermediate contact layer 52. For example, silicide 36 may be formed after intermediate contact layer 52 has been deposited and polished. In this embodiment, silicide 36 may be formed over intermediate contact layer 52 and doped polysilicon layer 24, and etched such that silicide 36 is removed from over portions of intermediate contact layer 52. In any case, silicide 36 may be formed using conventional methods known in the art. Contact 3, PMD layer 4, etc. may be formed over portions of silicide 36 and intermediate contact layer 52. Contact 3, PMD layer 4, etc. may be formed using techniques described herein (e.g., as described with reference to FIG. 1) and/or known in the art. As shown in FIG. 2 (and similarly in FIG. 3), contact 3 may be formed such that a portion of its lower surface is not in contact with silicide 36. For example, in the embodiment shown in FIG. 2, a portion of the lower surface of contact 3 abuts intermediate contact layer 52. In any case, intermediate contact layer 52 and silicide 16 may separate contact 3 from doped polysilicon layer 24.

Figure 3:
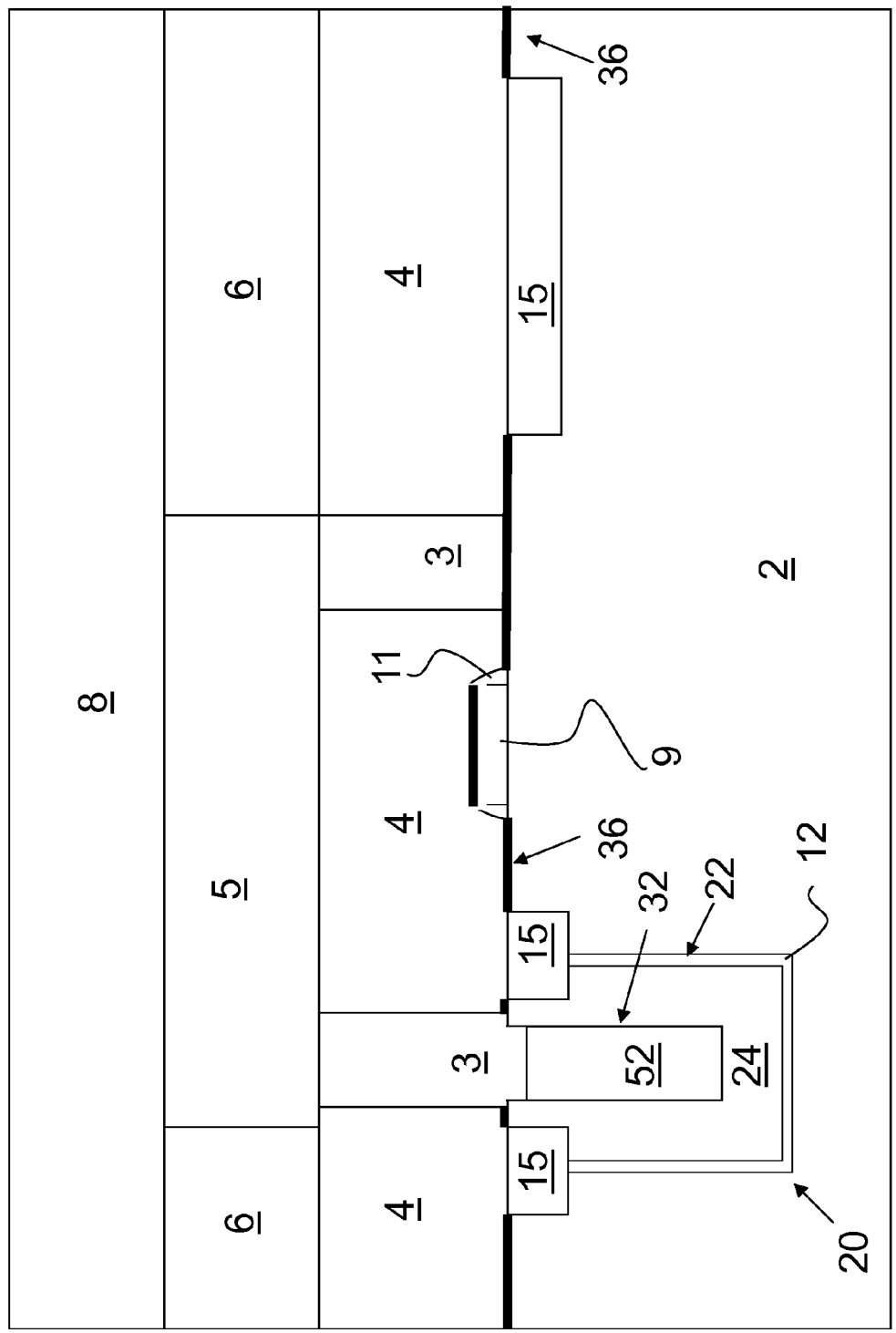

Turning to FIG. 3, an alternative embodiment of the semiconductor structure of FIG. 2 is shown. In this embodiment, forming of outer trench 22 and inner trench 32 may be performed substantially similarly as described with reference to FIG. 2. Further, intermediate contact layer 52 may be formed over doped polysilicon layer 24 as described with reference to FIG. 2. However, in this embodiment, contact 3 may plug a portion of inner trench 32 not filled by intermediate contact layer 52. That is, contact 3 may extend below an upper surface of substrate 2, and may extend below silicide 36 on the upper surface of substrate 2. In this embodiment, intermediate contact layer 52 may be removed (via, e.g., wet etching or RIE etching) below the upper surface of substrate 2, leaving a portion of inner trench 32 unfilled, and contact 3 may be formed within the unfilled portion of inner trench 32. As shown in FIG. 3, contact 3 may be formed such that a portion of its lower surface is not in contact with silicide 36. For example, in the embodiment shown in FIG. 3, a portion of the lower surface of contact 3 abuts intermediate contact layer 52 below an upper surface of substrate 2. Contact 3 may be formed according to techniques described herein and/or known in the art.

Figure 4:
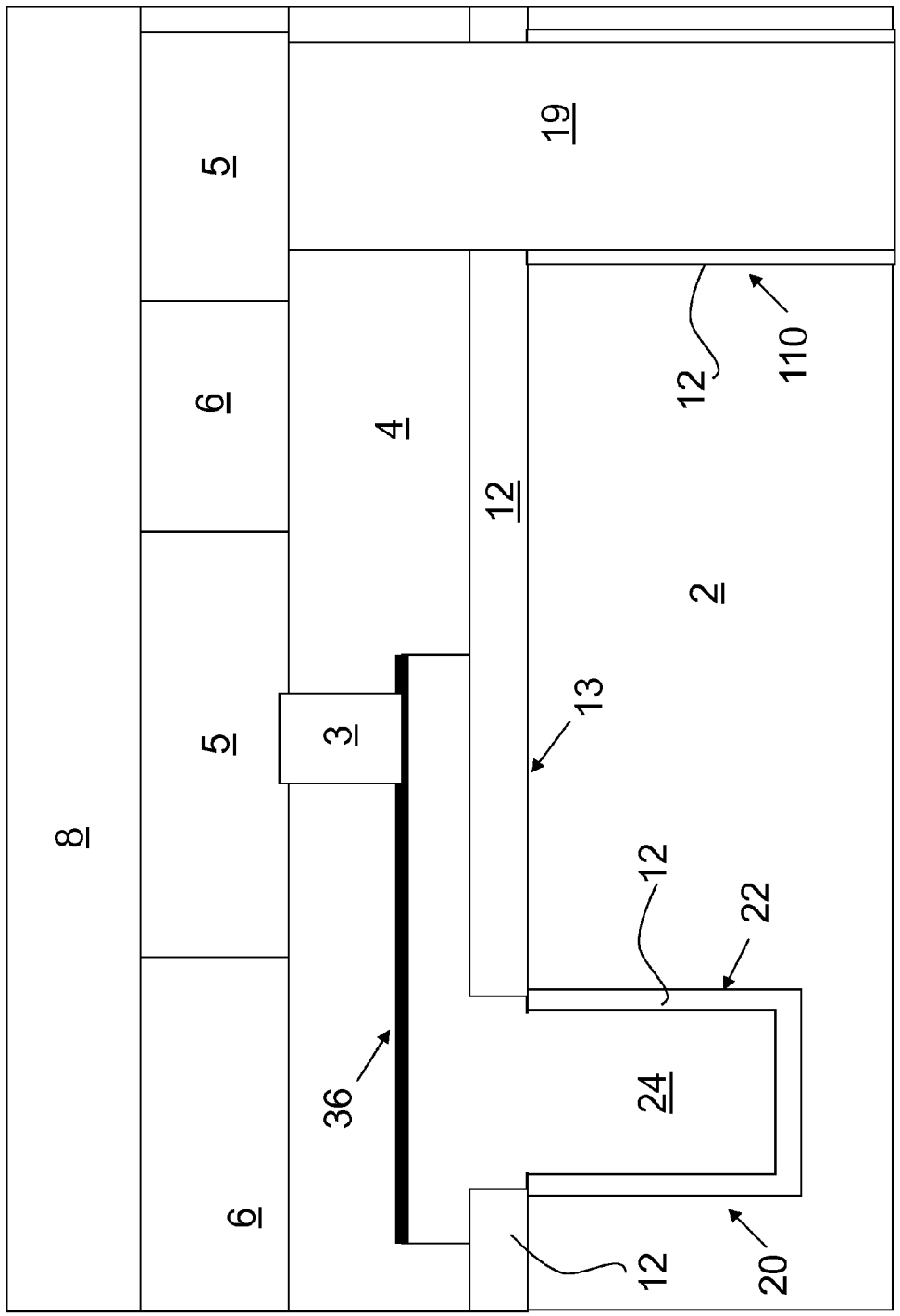
FIGS. 4-6 show cross-sectional views of semiconductor structures according to alternative embodiments.

Turning to FIG. 4, another embodiment of a semiconductor structure including a decoupling capacitor is shown. While many components of the structure shown in FIG. 4 may be similar to the structure of FIG. 1, one notable difference is that contact 3 may be misaligned with the trench capacitor 20. In this embodiment, the semiconductor structure may include a trench 22 in a substrate 2, the trench 22 lined with a dielectric liner layer (e.g. ONO or other dielectric liners described herein) 12 and filled with doped polysilicon layer 24. Trench 22 may be formed in substrate 2 in any conventional manner, and forming of dielectric liner layer 12 and doped polysilicon layer 24 within trench 22 and over an upper portion of substrate 2 may also be performed according to methods described herein and/or known in the art. In this structure, dielectric liner layer 12 may extend over an upper surface 13 of substrate 2, and doped polysilicon layer 24 may also extend over dielectric liner layer 12 above the upper surface 13 of substrate 2. Doped polysilicon layer 24 may be formed simultaneously with portions of dielectric liner layer 12 located inside trench 22, or may be formed separately. Dielectric liner layer 12 may also be patterned and etched (not shown) so that devices such as transistors (e.g. transistor 9 of FIG. 1) could be formed on or near the upper portion 13 of substrate 2. In an alternative embodiment, doped polysilicon layer 24 may be patterned and etched similarly to a polysilicon gate of a conventional transistor (not shown) instead of using the damascene process described above.

A silicide 36 may be formed over doped polysilicon layer 24 according to known methods, and a contact 3 may be formed to contact silicide 36 and/or any other structures on or above the silicon substrate 2 according to methods known in the art. Dielectric liner layer 12 may also line an optional insulated through wafer or through silicon via (TSV) opening 110. TSV opening 110 may further be filled with a conductive metal 19 such as, for example, TiN-lined-tungsten or Ta-lined-copper, to form a TSV. TSV opening 110 may be formed according to methods known in the art, and the TSV may contact a later-formed transistor 5, deep trench capacitor, solder bump contact on the wafer frontside, solder bump on the wafer backside formed directly under TSV opening 110, or other structures not explicitly described herein. It is further understood that the TSV shown in FIG. 4 could also be grounded to substrate 2. While shown only in FIGS. 4-6, it is further understood that the TSV could be included in any of the other embodiments shown and described herein. Forming of additional semiconductor layers and components may be performed according to methods known in the art. It should be noted that layers and structures which are commonly labeled between FIG. 1 and FIG. 4 (e.g., nitride layer 4, carbon-doped silicon oxide layer 6 (e.g., SiCOH), and a silicon carbon nitride layer 8) may be commonly formed and may include common materials.

Figure 5:
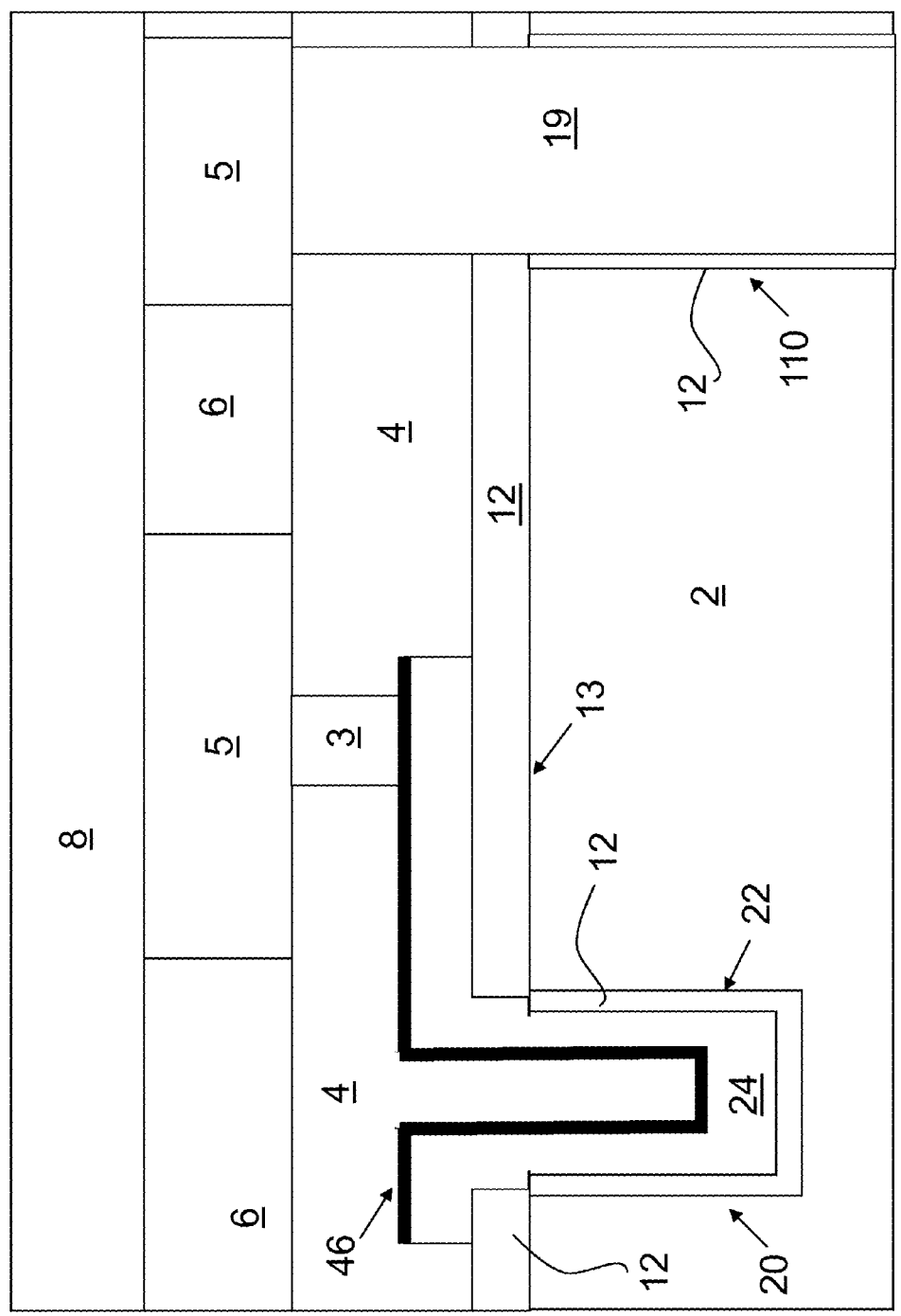

Turning to FIG. 5, an alternative embodiment of a semiconductor structure is shown. In this embodiment, a trench 22 may be formed within substrate 2 via conventional techniques, such as patterning a photomask and etching to expose portions of substrate 2 below an upper surface 13. After forming trench 22, a dielectric liner layer 12 may be deposited within trench 22 using conventional techniques such as those described with reference to the dielectric liner layer 12 of FIG. 1. Dielectric liner layer 12 may also be deposited over upper surface 13 of substrate 2 using conventional techniques. Dielectric liner layer 12 may also be deposited to line a TSV opening 110, as is known in the art. Dielectric liner layer 12 may include an oxide and/or a nitride, and may be deposited in different thicknesses in different portions of the semiconductor device. For example, dielectric liner layer 12 may be substantially thicker over upper portion 13 of substrate 2 than in portions of trench 22, or alternatively, may be substantially the same thickness throughout the semiconductor structure. TSV opening 110 may, for example, be later filled by a conductive metal such as, for example, TiN-lined-tungsten or Ta-lined-copper, to form a thru silicon via (TSV) as described with reference to FIG. 4. After depositing dielectric liner layer 12 in trench 22, a doped polysilicon layer 24 may be deposited over a portion of dielectric liner layer 12 within trench 22 and over a portion of dielectric liner layer 12 over upper surface 13 of substrate 2. After depositing doped polysilicon layer 24, a salicide (self-aligned silicide) layer 46 may be formed over upper surfaces of metal layer 24. Salicide layer 46 may be formed, for example, by depositing a transition metal layer (not shown) over doped polysilicon layer 24, heating the semiconductor device to allow for reaction of the transition metal layer with exposed silicon in the semiconductor device, and removal of excess transition metal to form a low-resistance transition metal silicide. Salicide layer 46 may be formed using any transition metal known in the art, including, for example, platinum. Salicide layer 46 may be self-aligned, that is, it may be formed without using a patterning process. After forming salicide layer 46, contact 3 and overlying portions of the semiconductor device may be formed using any techniques known in the art. As shown in FIG. 5, contact 3 may be mis-aligned with trench 22, such that contact 3 touches a portion of salicide layer 46 not directly overlying trench 22.

Figure 6:
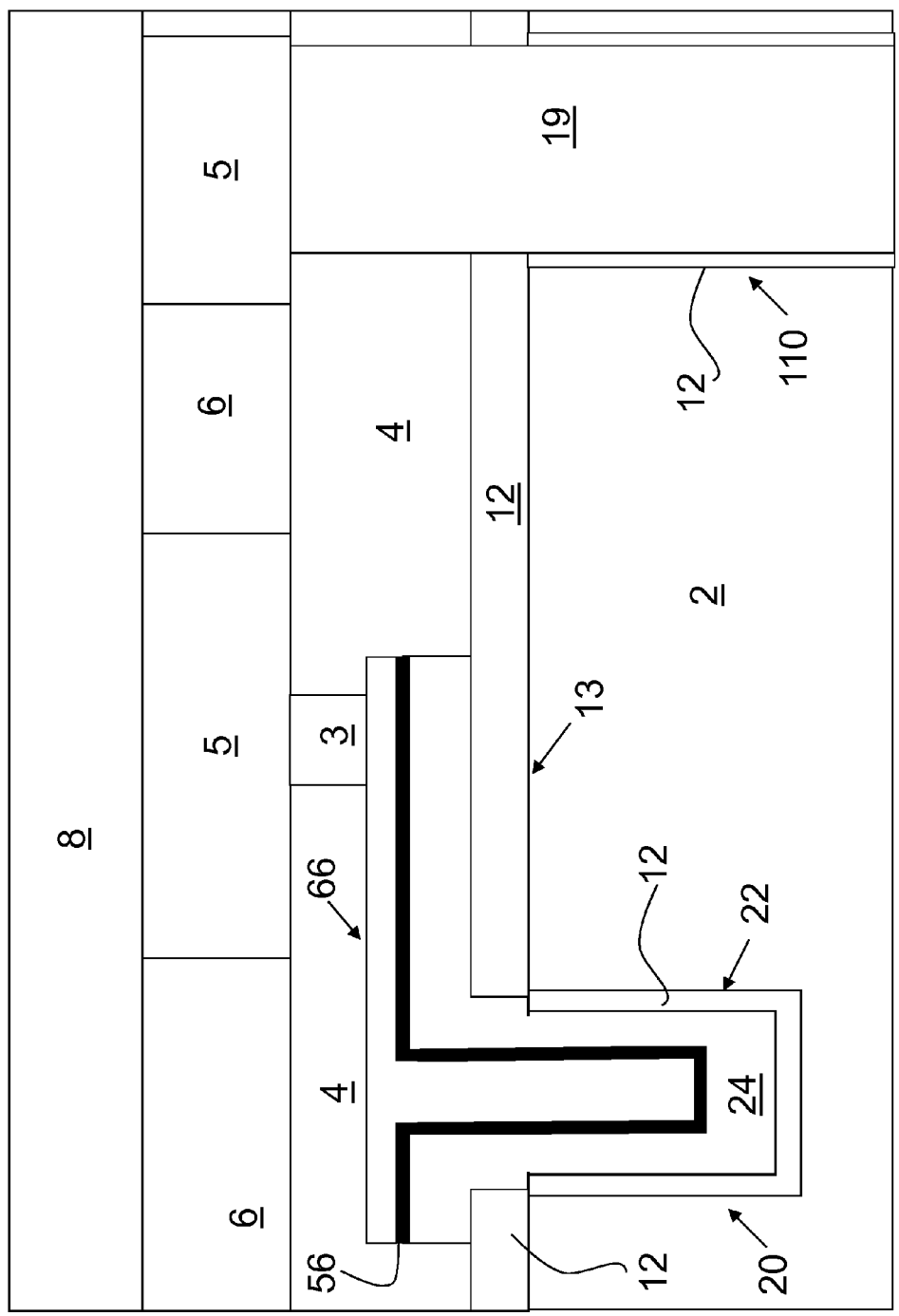

Turning to FIG. 6, an alternative embodiment of the semiconductor structure of FIG. 5 is shown. In this embodiment, formation of trench 22, dielectric liner layer 12, doped polysilicon layer 24, and TSV 19 may be performed in a substantially similar manner as shown and described with reference to FIG. 5. It is also understood that these layers may be formed using any other conventional techniques known in the art. In this embodiment, a polycide (silicide over polysilicon) layer 56 may be formed over doped polysilicon layer 24 using a silicide 66. For example, in one embodiment, a silicide 66 may be deposited over doped polysilicon layer 24 directly after the doped polysilicon layer 24 is formed, without a vacuum break. This process may eliminate oxidization of the doped polysilicon layer 24 surface, thereby allowing formation of polycide 56. This type of processing, where doped polysilicon and silicide (e.g., tungsten silicide) are deposited sequentially, patterned, and etched (using, e.g., RIE), is referred to as a polycide process. The structure of polycide 56 may be formed via conventional patterning techniques (e.g., lithography and deposition). As shown, polycide layer 56 and silicide 66 may substantially fill a portion of trench 22 not filled by doped polysilicon layer 24. As is similarly shown and described with reference to FIG. 5, a contact 3 may be formed to contact silicide 66, and may be misaligned with trench 22. Contact 3 may touch silicide 66 and form an electrical connection with other integrated circuit elements (e.g., a transistor). Formation of other components shown in FIG. 6 that are similarly numbered in FIGS. 1-5 may be performed in a substantially similar manner as described in the previous figures, or in other manners known in the art.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:
1. A semiconductor structure comprising:
    a silicon substrate;
    a trench structure including:
        a trench extending into the silicon substrate;
        a dielectric liner layer having a first portion within the trench in contact with the trench and a second portion extending over an upper surface of the silicon substrate outside of the trench;
        a doped polysilicon layer having a first portion over the first portion of the dielectric liner layer inside the trench and a second portion over the second portion of the dielectric liner layer outside of the trench; and
        a silicide layer having a first portion over the first portion of the doped polysilicon layer inside the trench and a second portion over the second portion of the doped polysilicon layer outside of the trench, the silicide layer and the doped polysilicon layer continuously contacting each other;
    a contact directly contacting the second portion of the silicide layer outside of the trench, the contact being mis-aligned with the trench;
    a premetal dielectric layer (PMD) over the second portion of the dielectric liner layer;
    a plurality of first level metal wires over the PMD layer, wherein one of the first level metal wires is separated from the contact;
    a thru-silicon via (TSV) extending from an upper surface of the PMD layer to a lower surface of the silicon substrate; and
    a conductive metal filling the TSV and extending from a bottom surface of the one of the first level metal wires to the lower surface of the silicon substrate.
2. The semiconductor structure of claim 1, wherein the dielectric liner layer is substantially thicker in the second portion outside of the trench than in the first portion inside the trench.

3. A semiconductor structure comprising:
a silicon substrate;
a trench structure including:
- a trench extending into the silicon substrate;
- a dielectric liner layer having a first portion within the trench in contact with the trench and a second portion extending over an upper surface of the silicon substrate outside of the trench;
- a doped polysilicon layer having a first portion over the first portion of the dielectric liner layer inside the trench and a second portion over the second portion of the dielectric liner layer outside of the trench;
- a polycide layer having a first portion over the first portion of the doped polysilicon layer in the trench and a second portion over the second portion of the doped polysilicon layer outside of the trench, the polycide layer and the doped polysilicon layer continuously contacting each other; and
- a silicide layer having a first portion over the first portion of the polycide layer in the trench and a second portion over the second portion of the polycide layer outside of the trench, the silicide layer and the polycide layer continuously contacting each other;
- a contact directly contacting the second portion of the silicide layer outside of the trench, the contact being mis-aligned with the trench;
- a premetal dielectric layer (PMD) over the dielectric liner layer over the second portion of the dielectric liner layer;
- a plurality of first level metal wires over the PMD layer, wherein one of the first level metal wires is and separated from the contact;
- a thru-silicon via (TSV) extending from an upper surface of the PMD layer to a lower surface of the silicon substrate; and
- a conductive metal filling the TSV and extending from a bottom surface of the one of the first level metal wires to the lower surface of the silicon substrate.

4. The semiconductor structure of claim 3, wherein the first portion of the polycide layer and the first portion of the silicide substantially fill a portion of the trench not filled by the doped polysilicon layer.

* * * * *